(12) United States Patent
Renken

(10) Patent No.: US 7,156,924 B2
(45) Date of Patent: Jan. 2, 2007

(54) SYSTEM AND METHOD FOR HEATING AND COOLING WAFER AT ACCELERATED RATES

(75) Inventor: Wayne Glenn Renken, San Jose, CA (US)

(73) Assignee: SensArray Corporation, Santa Clara, CA (US)

( * ) Notice: Subject to any disclaimer, the term of this patent is extended or adjusted under 35 U.S.C. 154(b) by 218 days.

(21) Appl. No.: 10/619,731

(22) Filed: Jul. 15, 2003

(65) Prior Publication Data
US 2004/0056017 A1 Mar. 25, 2004

Related U.S. Application Data

(63) Continuation-in-part of application No. 10/100,934, filed on Mar. 18, 2002, now abandoned.

(51) Int. Cl.
*C23C 16/00* (2006.01)
(52) U.S. Cl. .................................. 118/725; 118/724
(58) Field of Classification Search ............... 118/725, 118/724, 715; 156/345.52; 427/573, 576
See application file for complete search history.

(56) References Cited

U.S. PATENT DOCUMENTS

| | | | |
|---|---|---|---|
| 4,685,331 A | | 8/1987 | Renken et al. |
| 5,287,914 A | * | 2/1994 | Hughes ...................... 165/80.1 |
| 5,536,918 A | | 7/1996 | Ohkase et al. |
| 5,551,985 A | * | 9/1996 | Brors et al. .................. 118/725 |
| 5,580,830 A | * | 12/1996 | Nenyei et al. ............... 438/795 |
| 5,592,581 A | * | 1/1997 | Okase ......................... 392/418 |
| 5,670,218 A | | 9/1997 | Baek |
| 5,772,770 A | | 6/1998 | Suda et al. |
| 5,872,889 A | * | 2/1999 | Kaltenbrunner et al. ..... 392/418 |
| 5,900,064 A | * | 5/1999 | Kholodenko ............ 118/723 R |
| 5,965,047 A | * | 10/1999 | Blersch et al. .............. 219/390 |
| 6,097,005 A | * | 8/2000 | Akimoto .................. 219/444.1 |
| 6,111,225 A | | 8/2000 | Ohkase et al. |
| 6,140,256 A | * | 10/2000 | Ushikawa .................... 438/795 |
| 6,245,192 B1 | * | 6/2001 | Dhindsa et al. ......... 156/345.34 |
| 6,364,949 B1 | * | 4/2002 | Or et al. ........................ 118/69 |
| 6,494,955 B1 | | 12/2002 | Lei et al. |
| 6,753,506 B1 | * | 6/2004 | Liu et al. ..................... 219/390 |
| 2001/0050059 A1 | | 12/2001 | Hongo et al. |

FOREIGN PATENT DOCUMENTS

| | | |
|---|---|---|
| WO | WO 00/46840 | 8/2000 |
| WO | WO 00/62333 | 10/2000 |
| WO | WO 00/77833 | 12/2000 |

OTHER PUBLICATIONS

"Notification of Transmittal of the International Search Report or the Declaration", corresponding PCT application No. PCT/US03/08464, International Searching Authority, European Patent Office, Mar. 18, 2003, 7 pages.
European Patent Office, "Written Opinion", International Application No. PCT/US03/08464, May 10, 2004, 9 pages.
Smith et al., "Modeling the impact of thermal history during post exposure bake on the lithographic performance of chemically amplified resists", Proceeding of the SPIE, vol. 4345, pp. 1013-1021 (2001), Advances in Resists Technology and Processing XVIII.

* cited by examiner

*Primary Examiner*—Parviz Hassanzadeh
*Assistant Examiner*—Rakesh Dhingra
(74) *Attorney, Agent, or Firm*—Parsons Hsue & de Runtz LLP

(57) ABSTRACT

A highly dynamic heating and/or chilling chamber for processing semiconductor wafers. The chamber has uniform heat and gas flow distribution in order to minimize the temperature gradient at different points of the wafer.

29 Claims, 5 Drawing Sheets

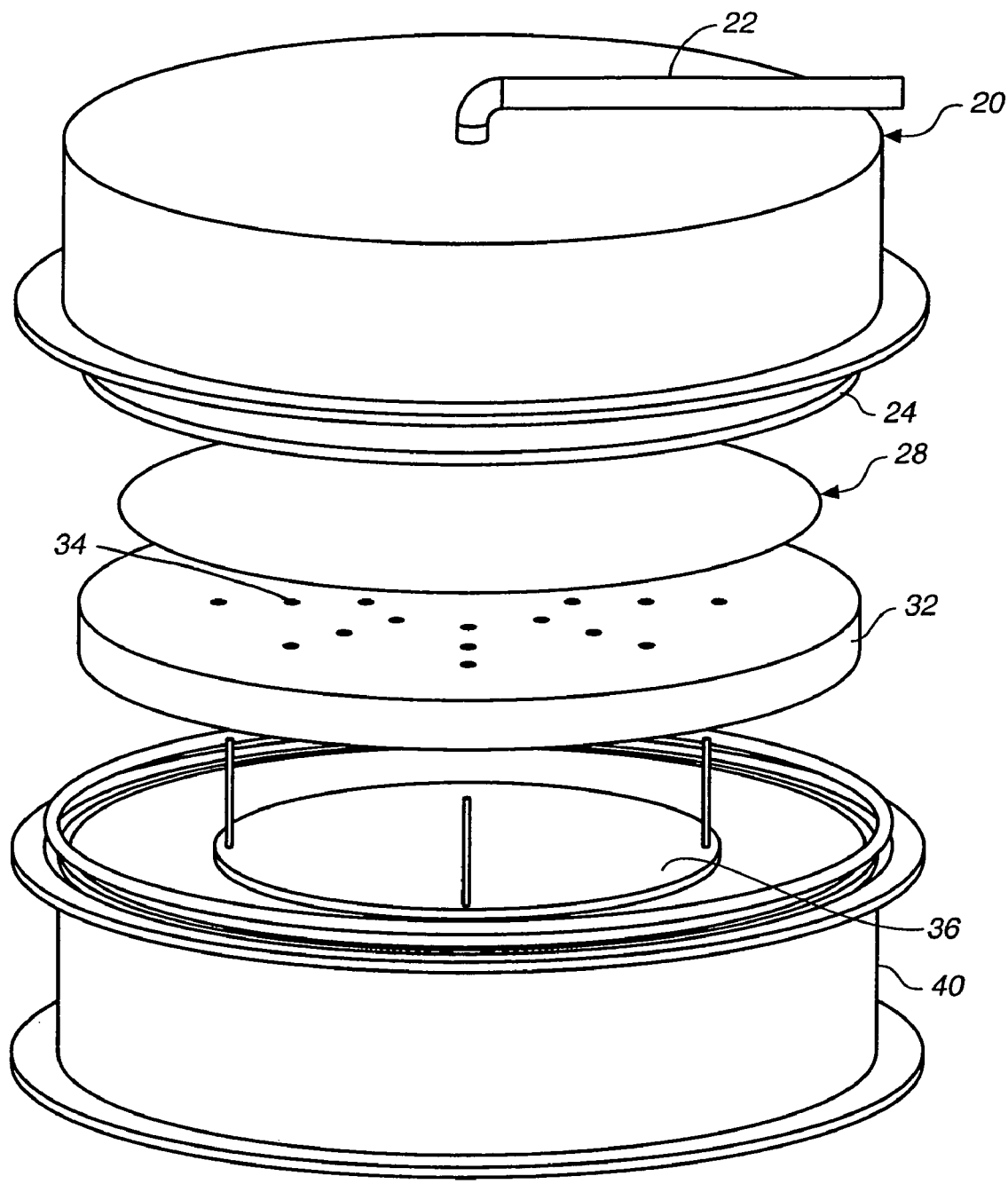
FIG._1
*(PRIOR ART)*

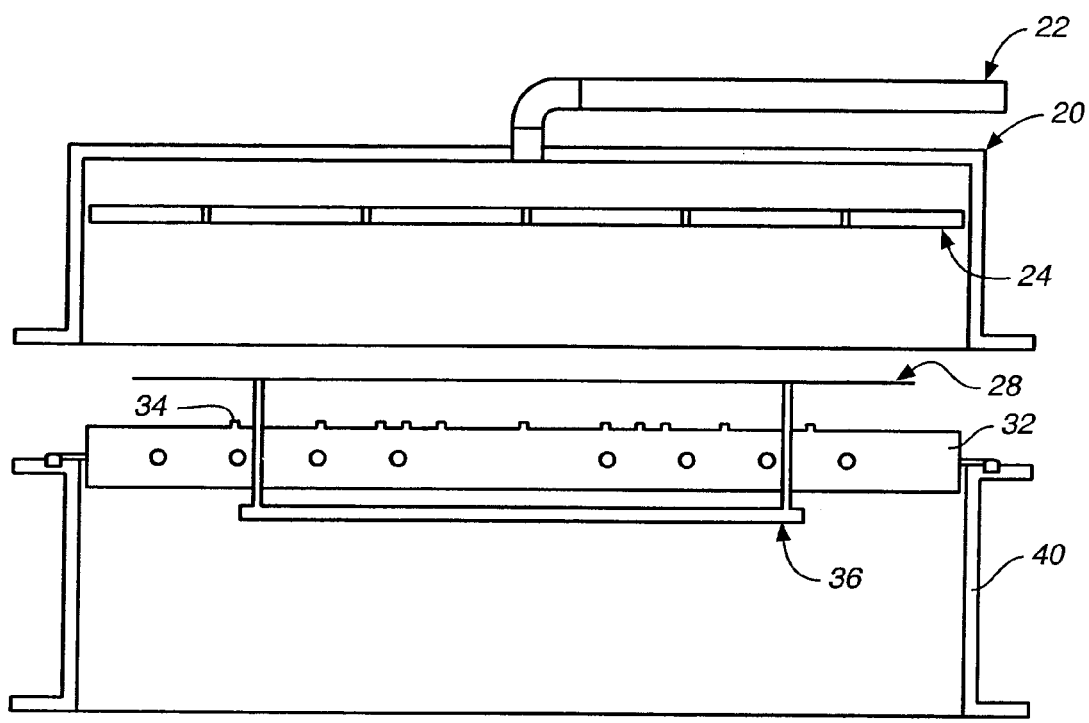
FIG._2 (PRIOR ART)
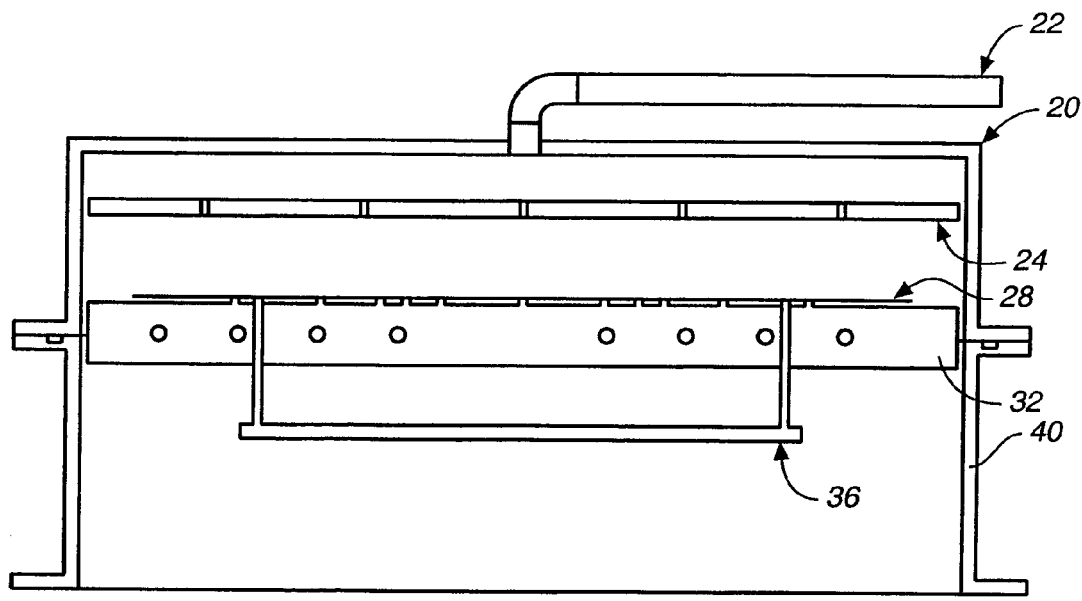
FIG._3 (PRIOR ART)

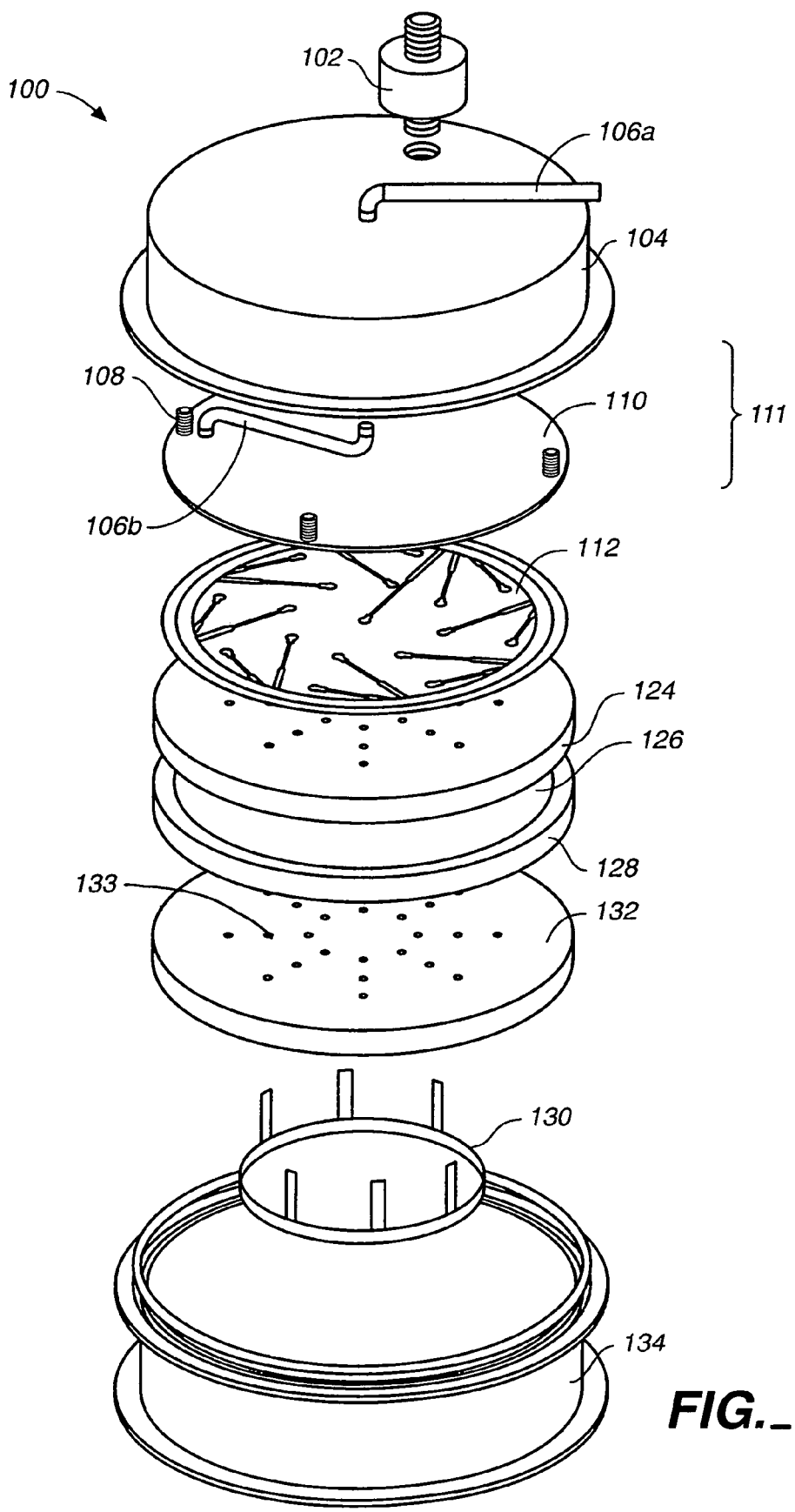
FIG._4

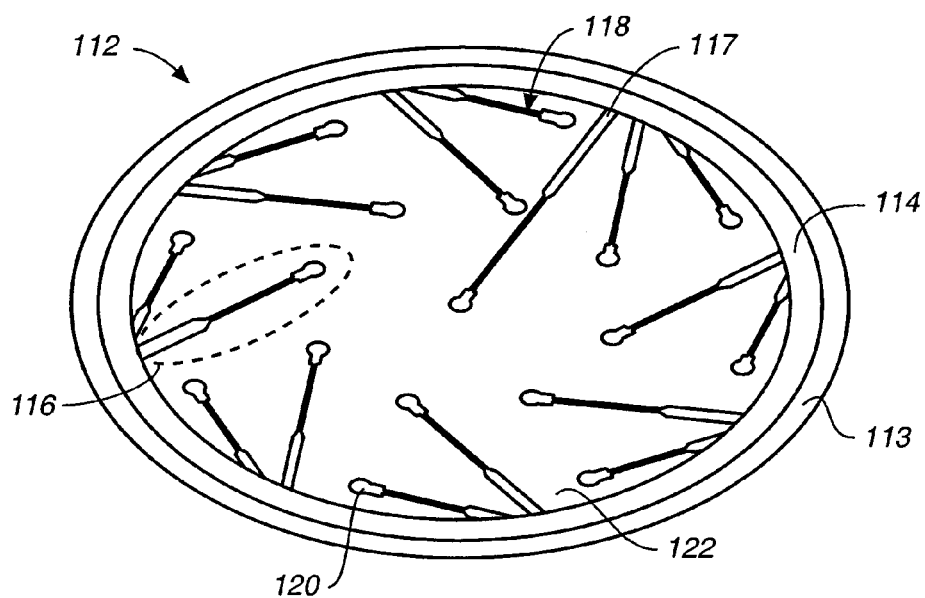
FIG._5
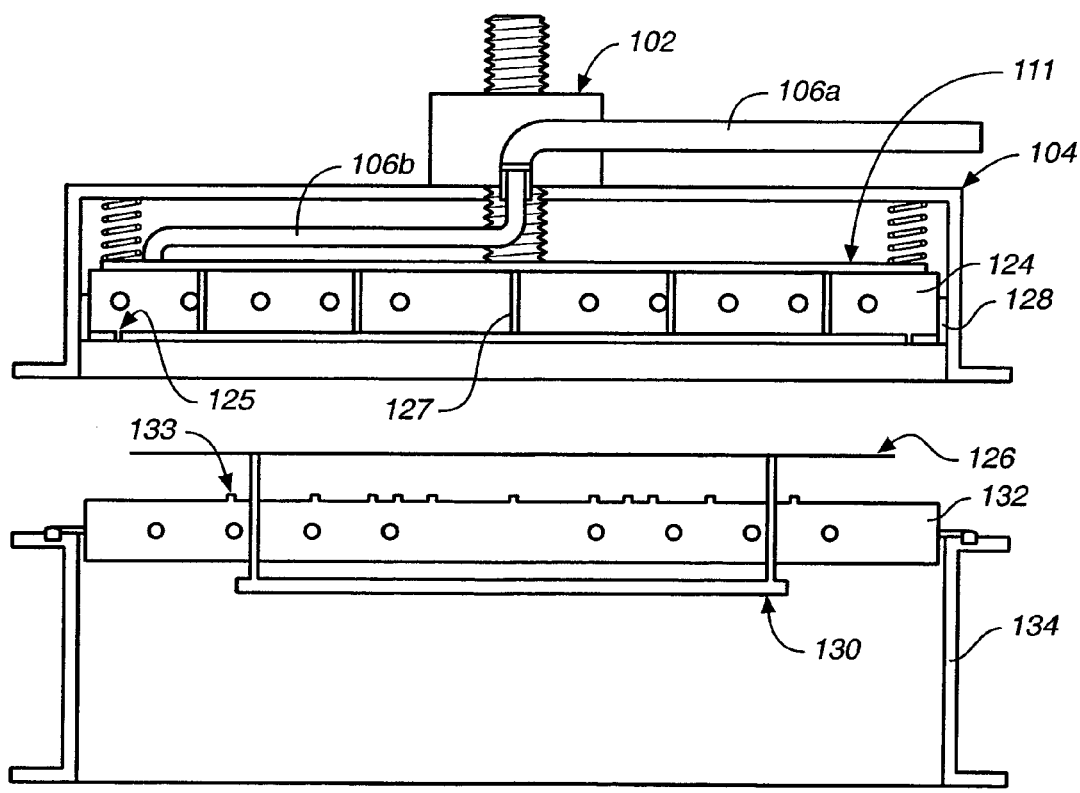
FIG._6

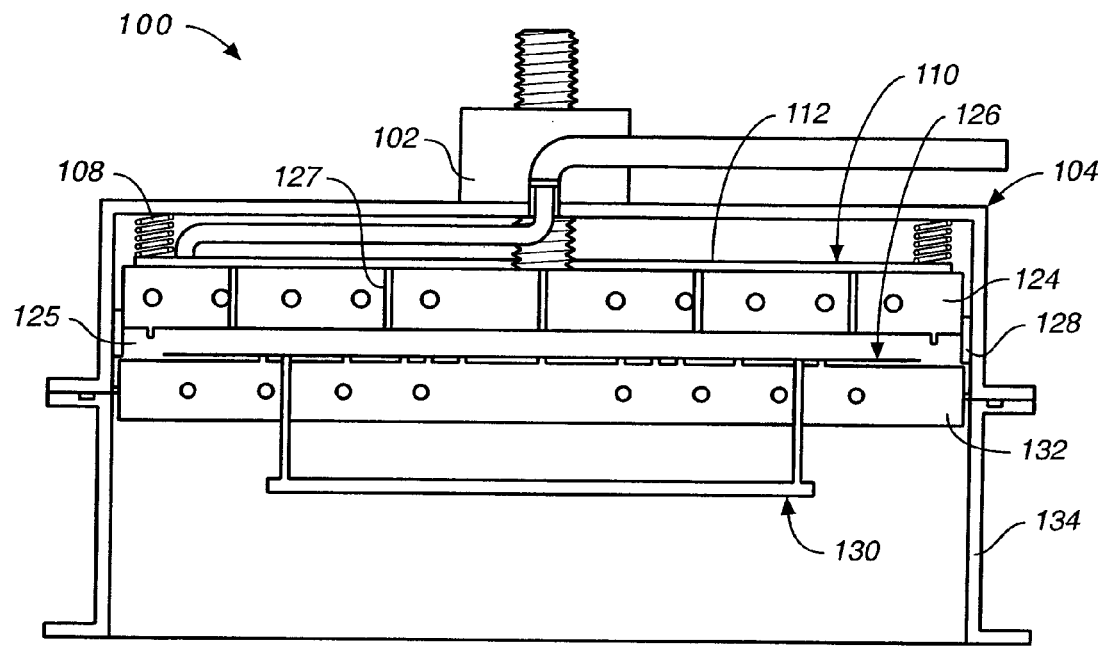
FIG._7
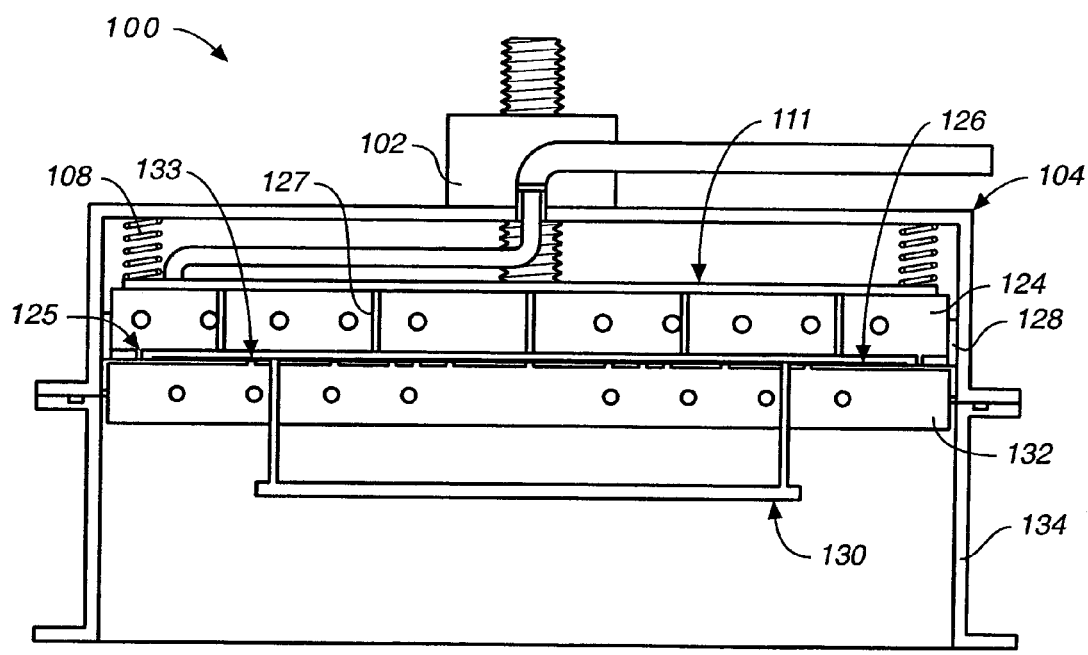
FIG._8

SYSTEM AND METHOD FOR HEATING AND COOLING WAFER AT ACCELERATED RATES

RELATED APPLICATIONS

This is a continuation-in-part of U.S. patent application Ser. No. 10/100,934 filed on Mar. 18, 2002 now abandoned, published Sep. 18, 2003 under No. 2003/0173346, and claims priority to PCT patent application Ser. No. PCT/US03/08464, filed on Mar. 18, 2003, published Oct. 2, 2003 under No. WO 03/081646A2, which applications are incorporated herein in their entirety by this reference.

BACKGROUND

1. Field of the Invention

The present invention relates generally to semiconductor processing, and relates more specifically to the heating and cooling of wafers used to make integrated circuits.

2. Related Art

Microelectronic devices are fabricated employing multiple layers of materials formed upon suitable carriers or substrates. Many of the layers of microelectronics materials must be patterned and registered accurately to produce fine dimensions. As circuit density and performance requirements have increased, the tolerances and dimensions of the patterns have become correspondingly smaller. It is common practice to form patterns in layers of microelectronic materials employing photolithography, wherein the layer of material to be patterned is coated with a light sensitive lacquer or photoresist material, which is then exposed to a pattern of light radiation to form the latent image of the pattern in the photoresist material. This latent image is then chemically developed to form a photoresist etch mask of the pattern, which can then be transferred to the underlying material layer by additive or subtractive processes such as etching or other analogous processes.

As feature sizes in the production of integrated circuits approach 100 nm, problems of packing density become increasingly difficult to overcome. The major problem is lithographic exposure tool resolution for exposure of photoresists. Photoresists and the manipulation of photoresists are well known in the art, but a short description of some important issues follows. Photoresists are applied as a thin film coating to a suitable substrate. Upon imagewise exposure of the coated substrate to actinic radiation, the difference in solubility rates between exposed and unexposed areas produces an image on the substrate after development. The uncovered substrate is thereafter subjected to an etching process. Frequently, this involves a plasma etching against which the resist coating must be sufficiently stable. For a positive tone photoresist, the coating protects those areas of the substrate from the etchant which were covered during the exposure, and thus the etchant is only able to etch the areas which were uncovered. The photoresist coating protects the covered areas of the substrate from the etchant and thus the etchant is only able to etch the uncovered areas of the substrate. Thus, a pattern can be created on the substrate which corresponds to the pattern of the mask or template that was used to create selective exposure patterns on the coated substrate prior to development.

The ability to reproduce very small dimensions is extremely important in the production of large scale integrated circuits on silicon chips and similar components. As the integration degree of semiconductor devices becomes higher, finer photoresist film patterns are required. One way to increase circuit density on such a chip is by increasing the resolution capabilities of the resist.

The optimally obtainable microlithographic resolution is essentially determined by the radiation wavelengths used for the selective irradiation. However, the resolution capacity that can be obtained with conventional deep UV microlithography (i.e. 248 nm) has its limits. In order to be able to sufficiently resolve optically small structural elements, e.g. features of 0.13 microns and smaller, radiation of ever shorter wavelengths (particularly 193 nm) is being employed together with a new generation of chemical amplification resist films.

A typical chemical amplification photoresist film comprises a polymer, a photoacid generator, and other optional additives. The polymer is required to be soluble in the chosen developer solution, and have high thermal stability and low absorbance to the exposure wavelength in addition to having excellent etch resistance. Chemically amplified photoresists are based on chemically amplified deblocking. With this mechanism, a molecule of photogenerated acid catalyzes the breaking of bonds in a protecting group of a polymer. During the deblocking process, another molecule of the same acid is created as a byproduct, and continues the acid-catalytic deblocking cycle.

Chemically amplified resists require both an exposure dose to generate a latent acid and image and a thermal dose to drive the deblocking reaction that changes the solubility of the resist in developer. Because the photogenerated acid diffuses through the resist as it catalyzes the deblocking reaction, the acid could diffuse into unexposed regions and have a significant impact on the quality of the image generated in the resist. An important criteria of the post-exposure bake process (PEB) is optimization of the balance between the relative rates of the diffusion and reaction processes. Pre diffusion reaction processes may include photo acid loss to the environment. The post diffusion reaction processes are more specifically, the amplification reaction and the acid loss reaction. Because the diffusivity and the reaction rate are both temperature dependent, careful manipulation and monitoring of the thermal history of the resist is critical to the final dimensions of the integrated circuit. The diffusion process, the amplification reaction process, and the acid loss reaction each have different activation energies. The activation energies for diffusion and for the amplification reaction are both high, whereas the activation energy for the acid loss reaction is low in comparison.

Because of this, the ramp or rise time is critical in the formation of dense features. Lines or other features that are densely located may join together in a process known as scumming, whereas isolated lines or features exposed to the same thermal dose will increase linearly and be well resolved. At the beginning of the bake, the acid loss reaction scavenges acid before the wafer reaches a temperature that is hot enough to drive the deblocking reaction. After the hotplate temperature is reached, acid loss, diffusion and amplification occur simultaneously. Delays in reaching the bake temperature can result in substantial acid loss before deblocking can begin, contributing to the aforementioned scumming process. For more information please refer to an article by Mark D. Smith which is hereby incorporated by reference in its entirety, entitled "Modeling the impact of thermal history during post exposure bake on the lithographic performance of chemically amplified resists," proceeding of SPIE, Vol. 4345, 1013–1021, 2001, Advances in Resist Technology and Processing XVIII.

FIGS. 1–3 illustrate a prior art oven used for post-exposure baking of silicon wafers. FIG. 1 is an exploded view of a prior art oven illustrating a top enclosure 20, gas inlet 22, showerhead 24, wafer 28, hot plate 32 with proximity pins 34, lift off pins 36 and bottom enclosure 40. FIG. 2 is a cross section of the prior art oven shown in FIG. 1 in the open position, with wafer 28 elevated from the surface of hotplate 32 and proximity pins 34. FIG. 3 is a cross section of the prior art oven shown in FIG. 1 in a closed potion, with the wafer 28 upon proximity pins 34 of hot plate 32. Showerhead 24 has passages to distribute the gas arriving from gas inlet 22. One example of such an oven is manufactured by Tokyo Electron Corporation (TEC) of Kumamoto, Japan.

Generally the proximity pins raise wafer 28 about 100–150 microns off of the surface of hot plate 32. In practice, wafer 28 cannot be made or maintained during prior processing perfectly flat, and there are differences in the degree of flatness from wafer to wafer. Because of the vertical temperature gradient within the oven, even small variations in flatness can result in a relatively large disparity in the temperature at different points across wafer 28. For example, if the wafer is concave such that the ends are further from hotplate 32 than the middle, the middle portion will be hotter than the ends. This variation may result in a rise time that differs by a factor of two at different areas of the wafer in the prior art design, and is thus detrimental to precision activation and control of the diffusion and reaction processes.

SUMMARY

One aspect of the present invention is a system for varying the temperature of a wafer comprising a first temperature controlled plate. A second temperature controlled plate has proximity pins, and the wafer is located between the first and second temperature controlled plates. The distance of the wafer from the first temperature controlled plate is maintained by proximity pins. The distance of the wafer from the second temperature controlled plate can be maintained in any number of ways but is preferably maintained by the proximity pins of the second hot plate. An enclosure surrounds the first and second temperature controlled plates and the wafer, and the enclosure comprises a gas input and output. A heat conducting gas flows from the input past the wafer and to the output.

Another aspect of the present invention involves a method of conditioning a wafer having a first and a second side within a chamber. The method comprises heating or cooling the wafer from the first side, heating or cooling the wafer from the second side, and applying a gas to the wafer, the gas distributed through a plurality of passages passing through one of the temperature control elements, such that the gas flow is controlled and is substantially laminar and spatially distributed.

Yet another aspect of the invention is a device for controlling the temperature of a wafer comprising a temperature control element, and a gas distribution system configured to distribute gas about a surface of the wafer, the gas distribution system comprising a plurality of flow paths, each of the plurality of flow paths comprising a laminar flow element. Within the device a wafer is located between the gas distribution system and the two temperature control elements.

Other aspects and advantages of the present invention will become apparent from the following descriptions and accompanying drawings

BRIEF DESCRIPTION OF THE FIGURES

The present invention may be better understood, and its numerous features and advantages made apparent by referencing the accompanying figures. For simplicity and ease of understanding, common numbering of elements within the illustrations is employed where an element is the same in different figures.

FIG. 1 is an exploded view of a prior art oven.
FIG. 2 is a cross section of the oven shown in FIG. 1.
FIG. 3 is a cross section of the oven shown in FIG. 1.
FIG. 4 is an exploded view of semiconductor processing chamber ("SPC") 100.
FIG. 5 is a perspective view of flow channel plate 112.
FIG. 6 is a cross section of SPC 100 in an open position.
FIG. 7 is a cross section of SPC 100 in a closed position.
FIG. 8 is a cross section of SPC 100 in a closed position.

DETAILED DESCRIPTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense, as it is understood that the present invention is in no way limited to the embodiments illustrated.

FIG. 4 illustrates an exploded view of semiconductor processing chamber ("SPC") 100. SPC 100 may be used to heat or cool a silicon wafer or other substrate in addition to supplying other process needs, such as gas distribution and vapor removal. SPC 100 has many applications in the field of silicon wafer processing. One such application is in the post-exposure bake process described earlier. Other applications will be readily apparent to those skilled in the art.

Silicon wafer 126 is conditioned within upper housing 104 and lower housing 134. Although SPC 100 may be used to cool the wafer as well as heat it and condition it in other ways, it may be referred to as an oven.

Mechanical assembly 102 drives the opening and closing of SPC 100, i.e. it brings together or separates the upper housing 104 and lower housing 134 to close or open SPC 100. The rate of closure and opening of the upper housing 104 and lower housing 134 may be varied by mechanical assembly 102, and other components (not shown). Gas transport tubes 106a and 106b are attached to upper housing 104 and cover plate 110 respectively. Gas transport tubes 106 route an incoming gas used in the conditioning process to flow manifold 111 which is formed by cover plate 110 and flow channel plate 112. Gas flows through manifold 111 through upper hot (or chill) plate 124 which functions as part of a gas distribution system. The gas applied is generally nitrogen but the gas distribution system can, of course, transport any gas to wafer 126. Springs 108 compress the various components of SPC 100 while allowing freedom of movement and size variations of the various components, including wafer 126.

Wafer 126 is supported on lower hot (or chill) plate 132 by proximity pins 133. Proximity pins 133 are positioned to keep wafer 126 uniformly distanced from the upper surface of lower hot plate 132. They may be concentrically arranged or arranged in any other pattern upon the surface of lower hot plate 132 to minimize warping of the wafer during the heating, cooling, and conditioning processes. Precise positioning of the wafer 126 is critical in order to uniformly heat, cool, or otherwise condition wafer 126. Misalignment or improper distancing of wafer 126 from either lower hot plate 132 or upper hot plate 124 would subject different areas of wafer 126 to different temperature profiles or gradients. Even minimal differences in the temperature profile that a wafer may be subjected to during the conditioning process can have major effects on the line width and circuit formation of integrated circuits being formed on/in wafer 126. In the case where hot plate 132 is used to heat the wafer, it has electrical heating elements embedded within it. In the case that hot plate 132 is used as a chill plate to cool the wafer, a thermoelectric cooler or any other well known means such as cool liquid passages may be employed. Thus, the term hot plate is defined as a temperature controlling plate that may either heat or cool its surroundings.

Lift pin assembly 130 is used to place wafer 126 on the proximity pins 133 when the wafer is inserted and also to lift wafer 126 from the proximity pins 133 when the wafer is removed from SPC 100.

Exhaust ring 128 restricts and controls the flow of exhaust exiting from the edge of hot plate 132 within SPC 100. Different levels of exhaust restriction can be tailored for different processing applications. Exhaust ring 128 assures uniformity of flow around the annular exhaust opening formed between exhaust ring 128 and hot plate 132. With the input and exhaust rate controlled, SPC 100 provides for radial adjustment and control of the gas flow rate over the surface of wafer 126. Distribution of the gas will now be described in further detail with regard to FIG. 5.

FIG. 5 shows flow channel plate ("FCP") 112 of manifold 111. Cover plate 110 (not shown) seals against the topside of FCP 112. Specifically, cover plate 110 makes direct contact with seal ring 113 and planar contact area 122. Alternatively, an additional gasket can be included between FCP 112 and cover plate 110. Gas arrives from gas transport tubes 106 through cover plate 110 into an annular channel formed by distribution ring 114, which is a recessed portion of FCP 112, and cover plate 110. FCP 112 is preferably formed by etching a piece of metal, or metal foil, although many other well know metal-working methods may be employed. Alternatively, cover plate 110 may be formed to provide the gas distribution ring. Additionally, although a metal such as nickel or stainless steel is preferred in order to avoid contamination of the wafer, any other material known in the art may be employed to form manifold 111. Distribution ring 114 is recessed relative to seal ring 113. Gas flows through the annular channel above distribution ring 114 through various distribution channels 116 to different areas of the surface of wafer 126 (not shown). Annular channel 114 ranges from 2 mm to 2 cm in width and from 0.2 mm to 5 mm in depth. Distribution channels 116 each have a feed passage 117 and a laminar flow passage ("LFP") 118. The laminar flow passages 118 assure constant and evenly distributed flow upon the surface of the wafer. The LFPs 118 are tailored to optimize the flow distribution for a range of applications. Generally speaking, the depth of distribution channels 116 may range from about 50 microns to about 800 microns and is preferably 150 microns. For more information on laminar flow passages please refer to U.S. Pat. No. 4,685,331 to Renken et al., entitled "Thermal Mass Flow Meter and Controller," which is hereby incorporated by this reference in its entirety. Feed passages 117 transport the gas from distribution ring 114 to LFPs 118. At the end of each distribution channel is gas delivery cavity 120. Each gas delivery cavity 120 is aligned with a gas passage through upper hot plate 124.

Any solvents or contaminants that are present within SPC 100, for instance those that may originate or evaporate from wafer 126 during the post-exposure bake and travel through the passages in upper hot plate 124, will condense and/or accumulate in gas delivery cavities 120. Thus, gas delivery cavities 120, which are fabricated to a much greater depth than the laminar flow passages to accommodate condensed contaminants, protect laminar flow passages 118 from contaminants and any resultant clogging or flow impediment.

FCP 112 is in direct contact and in close proximity with upper hot plate 124. Thus, FCP 112 is at nearly the same temperature as upper hot plate 124. Depending on whether the upper hot (chill) plate is acting to heat or cool the wafer, the gas flowing through manifold 111 will be heated or cooled to roughly the same temperature as the wafer. Furthermore, the gas also passes directly through passages in upper hot plate 124, thus further assuring that the gas temperature arrives at a temperature of SPC 100 very near to the temperature at or near the surface of wafer 126. Because of the large temperature controlled surface area used for gas transport, the relatively long presence time of the gas in contact with temperature controlled elements, and the direct passage of the gas through the temperature controlled elements, heat is efficiently transferred to the gas. In the fabrication of very small integrated circuits having, for example, line widths of 0.18 microns and smaller, this is a distinct advantage over the prior art, because the precise control of the temperature at the surface of the wafer directly impacts the relative rates of the diffusion and reaction processes, and thus the line width of the integrated circuits.

FIGS. 6–8 are cross sections of SPC 100 in various stages of operation. FIG. 6 shows SPC 100 open with wafer 126 in an elevated position. Wafer 126 is inserted onto lift pin assembly 130, which is in the up position. In FIG. 7, lift pin assembly 130 has lowered wafer 126 onto proximity pins 133 on lower hot plate 132. Upper hot plate 124 is in an up position as are flow channel plate 112 and cover plate 110 of manifold 111. One or both of hot (chill) plates 124 and 132 may be active in this stage in order to heat or cool wafer 126. In addition, the gas may be flowing or may be turned off. Note the gap between the upper hot plate 124 and wafer 126.

In FIG. 8, upper hot plate 124 has been lowered to the down position such that upper proximity pins 125 are in contact with lower hot plate 132. The temperature of wafer 126 may be controlled in many ways, and the temperature gradient within SPC 100 may also be adjusted by modulating hot plates 124 and 132 together or independently. The rate of movement (lowering or lifting) of the upper and lower hot plates may be varied by the system during operation in order to modulate the temperature profile. This may be controlled in conjunction with the opening and closing of the enclosure for complete control of the time/temperature profile of the wafer. By activating both the upper hot plate 124 and the lower hot plate 132, the gradient in SPC 100 is greatly minimized compared to prior art designs only having a lower hotplate. Furthermore, with the use of extending upper proximity pins 125, the distance between the upper and lower hot plates can be altered in process to provide maximum flexibility and adjustability to the temperature profile. The temperature schedules of the hot plates can also be programmed to individually vary with time during any given temperature cycle or profile. Generally speaking, the ramp time to a given temperature can be cut in half with the dual hot plate design of the current invention, in comparison the prior art designs. The ramp rate can also be much more precisely controlled compared to prior designs.

Furthermore, because the heat is applied to the wafer from both sides, flatness variations (warping) are better accommodated than with prior designs such as that of FIGS. 1–3. For example, if the wafer is warped such that the ends of the wafer are further from the lower hot plate 132 than the center portion of the wafer, those same ends will be nearer to upper hot plate 124. The warp of a 200 mm wafer can be up to about 75 microns. In other words, the reduced heat gradient between the lower and upper hot plates 124 and 132 minimizes the temperature difference that imperfect wafers would otherwise be subjected to. This, in turn, leads to more precise integrated circuit formation.

Gas can be applied to the wafer with upper hot plate 124 in the up or down position as seen in FIGS. 7 and 8. Also, in the cross sections of FIGS. 6–8, the gas passages 127 through upper hot plate 124 may be seen. As the gas flows through manifold 111 and gas passages 127 it is heated to the temperature of the upper hot plate 124. As mentioned previously, the temperature of upper hot plate 124 may be independently manipulated. Thus, the temperature of the gas distributed may also be heated or cooled to be at a selected temperature in order to produce a desired effect. The relatively long residual time of the gas and the large surface area of the heat transfer elements increases the precision temperature control of the gas, and thus the wafer, in comparison with prior art designs. In addition the control afforded by the laminar flow channels that are dispersed to provide even flow about the surface of the wafer yields better control of the temperature within SPC 100.

The precise temperature control and fast dynamic response of SPC 100 are assets in many operations. In particular, SPC 100 can better control the important transitions of chemically amplified resists. As mentioned previously, chemically amplified resists require differing thermal profiles and energies to activate diffusion, the amplification reaction, and the acid loss reaction. Thus, precise temperature control is of the utmost importance so that any reaction is not inadvertently started or affected. Because the photogenerated acid diffuses through the resist as it catalyzes the deblocking reaction, the acid may otherwise diffuse into unexposed regions and have a significant impact on the quality of the image generated in the resist. An important criteria of the post-exposure bake process (PEB) is optimization of the balance between the relative rates of the diffusion and reaction processes. Because the diffusivity and the reaction rate are both temperature dependent, careful manipulation and monitoring of the thermal history of the resist is critical to the final dimensions of the integrated circuit. The dual heating and cooling system and the precision gas distribution system of the present invention make this possible.

While embodiments of the present invention have been shown and described, changes and modifications to these illustrative embodiments can be made without departing from the present invention in its broader aspects. Thus, it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

The invention claimed is:

1. A system for varying the temperature of a wafer comprising:
    a first temperature controlled plate, the first temperature controlled plate comprising first proximity pins, the first proximity pins configured to distance the wafer from the first temperature controlled plate;
    a second temperature controlled plate comprising second proximity pins, the wafer located between the first and second temperature controlled plates, a distance from the second temperature controlled plate to the wafer established by the first and second proximity pins; and
    an enclosure surrounding the first and second temperature controlled plates and the wafer, the enclosure comprising a gas input and output, the gas flowing from the input past the wafer and to the output.

2. The system of claim 1 wherein the second proximity pins are moveable such that the distance between the first and second temperature controlled plates may be varied.

3. The system of claim 1 further comprising a flow distribution manifold configured to distribute the gas upon the wafer.

4. The system of claim 3 wherein the flow distribution manifold comprises a plurality of laminar flow paths, each of the plurality of laminar flow paths comprising one laminar flow element controlling the flow rate of said flow path, the laminar flow element providing gas to one gas passage that leads to the exterior of the flow distribution manifold.

5. The system of claim 4 wherein the laminar flow element comprises a horizontal channel formed in a surface of a substrate and the gas passage extends to an opposing surface of the substrate.

6. The system of claim 4 wherein each of the plurality of laminar flow paths further comprise a cavity such that any contaminants or solvents that may be present in the enclosure and that may enter the flow paths will accumulate in the cavity rather than in the laminar flow elements.

7. The system of claim 3 wherein the flow distribution manifold is in contact with the first temperature controlled plate, and wherein the gas distributed is at substantially the same temperature as the first temperature controlled plate.

8. The system of claim 7 wherein the first temperature control plate comprises flow channels and wherein the gas flows from the manifold and through the channels to the wafer.

9. The system of claim 1 further comprising a gas output flow regulator.

10. A device for controlling the temperature of a wafer comprising:
    a first temperature control element comprising first proximity pins for supporting the water;
    a second temperature control element comprising second proximity pins and spaced from the first temperature control element by the second proximity pins;
    a gas distribution system configured to distribute gas at different points about a surface of the wafer, the gas distribution system comprising a plurality of flow paths, each of the plurality of flow paths comprising a laminar flow element, the laminar flow paths formed as channels in a surface of a plate that is in thermal contact with the second temperature control element, an individual laminar flow path extending along a plane that is parallel to the plane of the wafer;
    an enclosure surrounding the first and second temperature control elements, the gas distribution system and the wafer; and wherein the wafer is located between the gas distribution system and the first temperature control element.

11. The device of claim 10 wherein the gas distribution system is temperature controlled thereby providing substantially uniform temperature distribution and gas flow distribution across the surface of the wafer.

12. The device of claim 11 wherein the gas distribution system and the first temperature control element can be adjusted to different temperatures in order to vary the temperature gradient within the device.

13. The device of claim 10 further comprising an exhaust system configured to regulate the exhaust flow rate of the gas.

14. The device of claim 10 wherein the gas distribution system comprises one or more heating and cooling elements.

15. A post exposure bake chamber comprising:
a first heating plate comprising first proximity pins;
a second heating plate comprising second proximity pins;
the first and second heating plates configured to heat a wafer placed between the plates, the wafer spaced from the first heating plate by first proximity pins, the second heating plate spaced from the first heating plate by second proximity pins when the second heating plate is in a closed position, the second heating plate being more distant from the first heating plate when in an open; and
an enclosure that surrounds the first heating plate and the second heating plate.

16. The post exposure bake chamber of claim 15 further comprising a flow control system having distributed gas flow paths and one or more flow control elements regulating the gas flow rate through the gas flow paths.

17. The post exposure bake chamber of claim 16 wherein the flow control system is in contact with the first heating plate such that the gas is heated by the first heating plate.

18. The post exposure bake chamber of claim 16 wherein the gas passes from the flow control system through passages in the first heating plate to the wafer.

19. The post exposure bake chamber of claim 16 wherein the flow control system comprises a flow channel plate, the one or more flow control elements formed in the flow channel plate.

20. A system for varying the temperature of a wafer comprising:
an upper temperature altering device;
a lower temperature altering device with a first plurality of proximity pins for supporting the wafer, the wafer located between the upper and lower temperature altering devices;
a second plurality of proximity pins on the upper temperature altering device that determine the spacing between the upper temperature altering device and the lower temperature altering device; and
an enclosure surrounding the upper and lower temperature altering devices and the wafer, the enclosure comprising a gas input and output, the gas flowing from the input past the wafer and to the output, the system varying a rate of movement of the upper temperature altering device or the rate of closure of the enclosure to adjust the temperature of the wafer.

21. The system of claim 20 wherein the system is further operable to vary a rate of change of the temperature of the wafer by adjusting the rate of closure.

22. The system of claim 20 wherein the enclosure comprises an upper portion and a lower portion, and wherein the system is operable to vary a rate of closure of the upper or lower portion.

23. A device for controlling the temperature of a wafer within an enclosure having a first and second enclosing structures, the device comprising:
a first temperature control element comprising first proximity pins;
a second temperature control element comprising second proximity pins; and
a gas distribution system configured to distribute gas at different points about a surface of the wafer, the gas distribution system comprising a plurality of flow paths, and a laminar flow element,
wherein the wafer is located between the gas distribution system and the first temperature control element, the wafer spaced from the first temperature control element by the first set of proximity pins, the second temperature control element spaced from the first temperature control element by the second set of proximity pins; and
wherein the enclosure encloses the first and second temperature control elements and the gas distribution system, and the device adjusts the rate of opening and closure of the enclosure by varying one or more rates of movement of the first or second enclosing structures.

24. An apparatus that controls the temperature of a wafer, comprising:
a lower temperature controlled plate comprising first proximity pins and disposed below the wafer;
a gas distribution system extending above the wafer to deliver gas at a plurality of locations across a surface of the wafer;
an upper temperature controlled plate above the wafer and comprising a plurality of second proximity pins extending from its lower surface, the upper temperature controlled plate being movable with respect to the lower temperature controlled plate; and
an enclosure surrounding the lower temperature controlled plate, the gas distribution system and the upper temperature controlled plate.

25. The apparatus of claim 24 wherein the wafer is displaced from an upper surface of the lower temperature controlled plate by lower pins extending from the lower temperature controlled plate.

26. The apparatus of claim 24 wherein a lower limit of movement of the upper temperature controlled plate is established by the upper pins extending from the upper temperature controlled plate, the upper pins contacting the lower temperature controlled plate when the lower limit is reached.

27. The apparatus of claim 24 wherein the upper and lower temperature controlled plates are resistively heated plates.

28. The apparatus of claim 24 wherein the upper and lower temperature controlled plates are chill plates.

29. The apparatus of claim 24 wherein the speed of movement of the upper temperature controlled plate is controlled to achieve a desired temperature profile.

* * * * *